US009018036B2

(12) United States Patent
Kim et al.

(10) Patent No.: US 9,018,036 B2
(45) Date of Patent: Apr. 28, 2015

(54) METHODS OF FORMING PATTERNS ON A SUBSTRATE

(75) Inventors: Joong-hyuk Kim, Seoul (KR); Sung-gyu Kang, Gyeonggi-do (KR); Seung-ho Lee, Gyeonggi-do (KR); Jae-woo Chung, Gyeonggi-do (KR); Young-ki Hong, Gyeonggi-do (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 426 days.

(21) Appl. No.: 13/448,438

(22) Filed: Apr. 17, 2012

(65) Prior Publication Data

US 2013/0106942 A1 May 2, 2013

(30) Foreign Application Priority Data

Oct. 31, 2011 (KR) ........................ 10-2011-0112497

(51) Int. Cl.
*H01L 51/40* (2006.01)
*B41J 2/16* (2006.01)

(52) U.S. Cl.
CPC *B41J 2/16* (2013.01); *B41J 2/1626* (2013.01); *B41J 2/1631* (2013.01)

(58) Field of Classification Search
USPC ............................... 257/40, E51.001; 438/99
See application file for complete search history.

(56) References Cited

U.S. PATENT DOCUMENTS

| | | | | |
|---|---|---|---|---|
| 6,613,399 | B2 * | 9/2003 | Miyamoto et al. | 427/558 |
| 7,612,455 | B2 * | 11/2009 | Tano et al. | 257/779 |
| 7,682,652 | B2 * | 3/2010 | Baik et al. | 427/58 |
| 2006/0159838 | A1 * | 7/2006 | Kowalski et al. | 427/58 |

FOREIGN PATENT DOCUMENTS

| | | | |
|---|---|---|---|
| KR | 20080050780 | A | 6/2008 |
| KR | 20100028306 | A | 3/2010 |
| KR | 20100110982 | A | 10/2010 |
| KR | 20110002917 | A | 1/2011 |
| KR | 20110017956 | A | 2/2011 |
| KR | 20110052953 | A | 5/2011 |

* cited by examiner

*Primary Examiner* — Anthony Ho
(74) *Attorney, Agent, or Firm* — Harness, Dickey & Pierce, P.L.C.

(57) ABSTRACT

A method of forming patterns on a substrate, the method including: placing a mask having an opening defining a portion of one surface of a substrate on which patterns are to be formed on the substrate; forming a first modification layer in the opening by ejecting a surface modification ink onto a surface of the substrate through the opening; ejecting a target ink having droplets of sizes larger than those of a surface modification ink such that the target ink is distributed on the first modification layer in the opening; and removing the mask.

13 Claims, 6 Drawing Sheets

METHODS OF FORMING PATTERNS ON A SUBSTRATE

CROSS-REFERENCE TO RELATED APPLICATIONS

This application claims priority under 35 U.S.C. §119(a) to Korean Patent Application No. 10-2011-0112497, filed on Oct. 31, 2011, in the Korean Intellectual Property Office, the entire disclosure of which is incorporated herein by reference.

BACKGROUND

1. Field

Example embodiments relate to methods of forming patterns on a surface of a substrate using an inkjet printing method.

2. Description of the Related Art

Generally, an inkjet printing device prints an image by ejecting fine ink droplets to desired locations on a printing medium via nozzles of an inkjet head. Recently, inkjet printing devices are used in various fields, such as flat panel displays including liquid crystal displays (LCDs) and organic light emitting devices (OLEDs), flexible displays including e-paper, printed electronics including metal wiring, organic thin-film transistors (OTFTs), biotechnology, bioscience, or the like.

In using an inkjet printing device for manufacturing displays or printed electronic circuits, one of the most important technical objectives is to prevent an open-circuit or a short-circuit in wirings. Due to a difference between surface energies of ink ejected and a substrate to be printed on, ink droplets ejected onto the substrate tend to bulge. More specifically, as a surface tension of ink increases, ink droplets ejected onto the substrate bulge, and thus, ink may not be continuously printed. As the surface tension of ink decreases, ink droplets ejected onto the substrate are not well contained, and thus a short-circuit may occur between neighboring wirings.

SUMMARY

Example embodiments provide methods of forming conductive patterns capable of reducing (or alternatively, eliminating) open-circuits or short-circuits in wirings.

At least one example embodiment also provides are methods of promptly forming relatively thick conductive patterns on a substrate.

According to at least one example embodiment, an inkjet printing method includes: placing a mask having an opening defining a portion of one surface of a substrate on which conductive patterns are to be formed; forming a first modification layer in the opening by ejecting a surface modification ink onto a surface of the substrate through the opening; ejecting a target ink having droplets of sizes larger than those of a surface modification ink such that conductive metal particles are distributed on the first modification layer in the opening; and removing the mask.

In at least one example embodiment, a difference between surface energies of the surface modification ink and the substrate may be less than or equal to a difference between surface energies of the target ink and the substrate.

In at least one example embodiment, the surface modification ink and the target ink may be the same.

In at least one example embodiment, the method may further include forming a second modification layer that is phobic to the target ink on at least a surface of the mask before forming the first modification layer. The second modification layer may be formed on the surface of the substrate inside the opening, and the first modification layer may be formed on the second modification layer. A contact angle of the target ink with respect to the second modification layer may be 50 or more degrees.

At least one other example embodiment provides a method of forming conductive patterns, the method including: defining a portion of a surface of a substrate in which conductive patterns are to be formed by using a mask having an opening; forming a first modification layer on the surface of the substrate through the opening, wherein a difference between surface energies of a surface modification layer and the substrate is less than or equal to a difference between surface energies of a target ink and the substrate; ejecting the target ink into the opening such that conductive metal particles are distributed on the first modification layer; and removing the mask.

In at least one example embodiment, the mask may be formed of a material that is phobic to the target ink.

In at least one example embodiment, the method may further include forming a second modification layer that is phobic to the target ink on at least a surface of the mask before forming the first modification layer. The second modification layer may be formed on the surface of the substrate inside the opening, and the first modification layer may be formed on the second modification layer.

In at least one example embodiment, the first modification layer may be formed by ejecting a surface modification ink that is philic to the target ink in the opening.

In at least one example embodiment, the surface modification ink and the target ink may be the same.

In at least one example embodiment, sizes of droplets of the target ink may be larger than those of the surface modification ink.

BRIEF DESCRIPTION OF THE DRAWINGS

Example embodiments will become apparent and more readily appreciated from the following description of the accompanying drawings in which.

DETAILED DESCRIPTION OF EXAMPLE EMBODIMENTS

Figure 1:
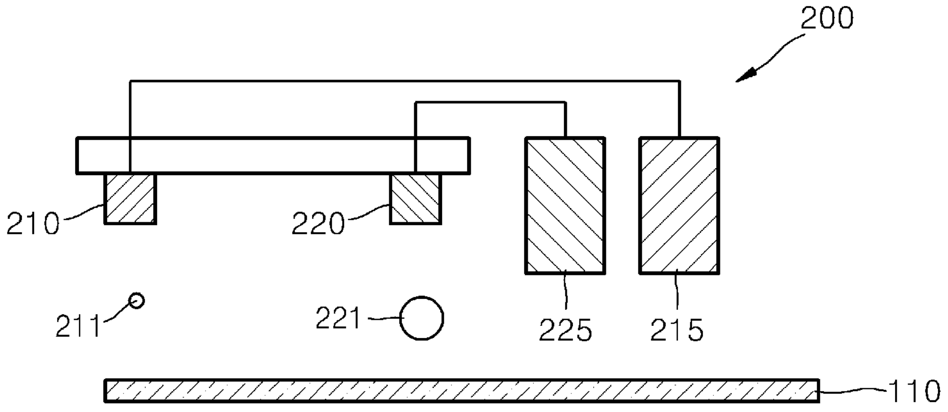
FIG. 1 is a schematic diagram of an inkjet printing device for performing a method of forming conductive patterns, according to at least one example embodiment.

Example embodiments will now be described more fully with reference to the accompanying drawings, in which some example embodiments are shown. In the drawings, the thicknesses of layers and regions are exaggerated for clarity. Like reference numerals in the drawings denote like elements.

Detailed illustrative embodiments are disclosed herein. However, specific structural and functional details disclosed herein are merely representative for purposes of describing example embodiments. Example embodiments may be embodied in many alternate forms and should not be construed as limited to only those set forth herein.

It should be understood, however, that there is no intent to limit this disclosure to the particular example embodiments disclosed. On the contrary, example embodiments are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of this disclosure. As used herein, the term "and/or," includes any and all combinations of one or more of the associated listed items.

It will be understood that when an element is referred to as being "connected," or "coupled," to another element, it can be directly connected or coupled to the other element or intervening elements may be present. In contrast, when an element is referred to as being "directly connected," or "directly coupled," to another element, there are no intervening elements present. Other words used to describe the relationship between elements should be interpreted in a like fashion (e.g., "between," versus "directly between," "adjacent," versus "directly adjacent," etc.).

The terminology used herein is for the purpose of describing particular embodiments only and is not intended to be limiting. As used herein, the singular forms "a," "an," and "the," are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

Spatially relative terms, such as "below", "beneath", "lower", "above", "upper", and the like, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

FIG. 1 is a schematic diagram showing an inkjet printing device 200 for performing a method of forming conductive patterns according to at least one example embodiment. Referring to FIG. 1, the inkjet printing device 200 includes a surface modification inkjet head 210 and a target inkjet head 220. Liquid may be ejected from inkjet heads 210 and 220 by a variety of methods, such as a piezoelectric method using a piezoelectric driving force, an electrostatic method using an electrostatic driving force, and a piezoelectric and electrostatic combination method of using the piezoelectric and electrostatic methods. The surface modification inkjet head 210 and the target inkjet head 220 may be movable on a substrate 110 and eject surface modification ink 211 and target ink 221 to form desired (or alternative, predetermined) printed patterns on the surface of the substrate 110. The surface modification inkjet head 210 may be connected to a surface modification ink chamber 215 that supplies the surface modification ink 211. The target inkjet head 220 may be connected to a target ink chamber 225 that supplies the target ink 221.

According to at least one example embodiment, the target ink 221 may be a solution through which, for example, Au, Ag, or Cu conductive particles are distributed. When a solvent is vaporized after the target ink 221 is ejected onto the substrate 110, conductive particles remain on the substrate 110 and form conductive patterns.

Figure 2:
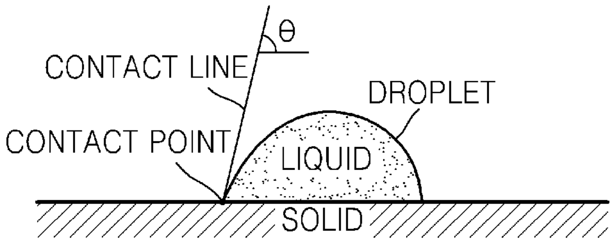
FIG. 2 is a diagram of a contact angle of a liquid on the surface of a solid.
Figure 3:
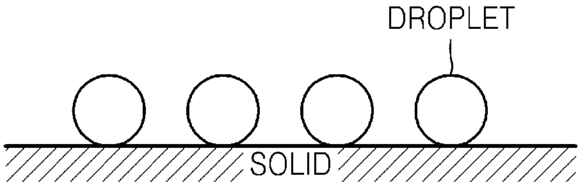
FIG. 3 is a diagram showing a state of a liquid on the surface of a solid if a difference in surface energies between the liquid and the solid is relatively large.
Figure 4:
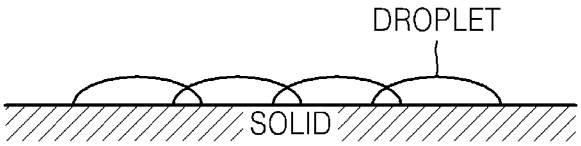
FIG. 4 is a diagram showing a state of a liquid on the surface of a solid if a difference in surface energies between the liquid and the solid is relatively small.

FIG. 2 is a diagram showing a contact angle of a liquid on the surface of a solid. Referring to FIG. 2, if the liquid is placed on a plane surface of the solid, the liquid becomes droplets that maintain a certain lens shape. At this time, the surface of droplets is curved. A contact angle θ is formed by a contact line drawn between the surface of droplets and the surface of the solid at a contact point where the solid and the droplet contact each other. The contact angle θ is generally determined according to types of the liquid and solid. The larger the contact angle θ, the more the liquid is phobic to the solid, and the smaller the contact angle θ, the more the liquid is philic to the solid. The greater the difference between surface energies of the liquid and solid, the greater the contact angle θ. If the contact angle θ is large, the liquid does not easily spread onto the surface of the solid, and the liquid does not completely wet the surface of the solid. As shown in FIG. 3, the liquid bulges in droplets on the surface of the solid. Thus, neighboring droplets do not well form together, and unwanted spaces may occur between the droplets. When the contact angle θ is small, as shown in FIG. 4, the liquid spreads along the surface of the solid, and neighboring droplets blend together, and thus the liquid completely wets the surface of the solid.

Still referring to FIG. 3, droplets of the target ink 221 do not agglomerate when the target ink 221 is ejected onto the surface of the substrate 110 and the difference in surface energies between the target ink 221 and the substrate 110 is great. As a result, the conductive patterns may contain discontinuities and open-circuits may form after the solvent is vaporized.

However, in at least one example embodiment, the surface modification ink 211 is introduced to reduce the difference in surface energies between the target ink 221 and the substrate 110. According to example embodiments, the difference in surface energies between the surface modification ink 211 and the substrate 110 is smaller than or equal to the difference in surface energies between the target ink 221 and the substrate 110. Because a contact angle between the surface modification ink 211 and the target ink is smaller, droplets of the target ink 221 may better form on the surface modification ink 211. Thus, conductive patterns may be continuously formed without open circuits when the surface modification ink 211 is ejected onto the substrate 110 before the target ink 221.

A method of forming conductive patterns using an inkjet printing method according to at least one example embodiment will now be described below.

Figure 5A:
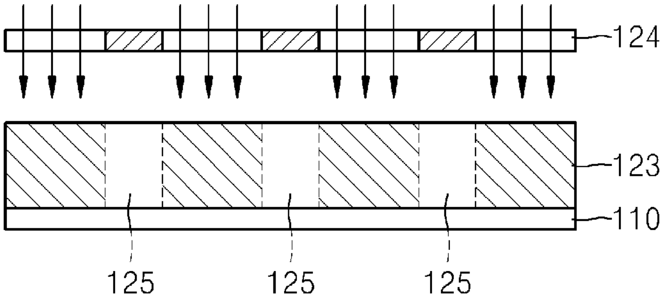
FIGS. 5A through 5F are diagrams showing a method of forming conductive patterns, according to at least one example embodiment.
Figure 5B:
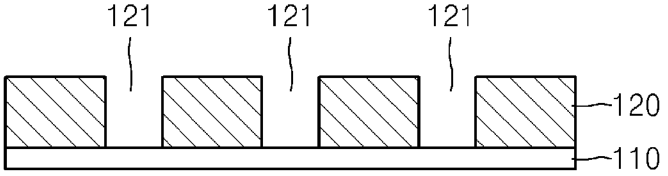

FIG. 5B shows a mask 120 having an opening 121 defining a portion of an upper surface of the substrate 110 in which the conductive patterns are to be formed. A glass substrate, for example, may be used as the substrate 110. However, example embodiments are not limited thereto, and the substrate 110 may be formed of various types of materials according to an application thereof. The mask 120, for example, as shown in FIG. 5A, may be formed by forming a photoresist layer 123 on the upper surface of the substrate 110, exposing and hardening a region excluding a region 125 corresponding to the opening 121 of the photoresist layer 123 by using an exposure mask 124, and removing the region 125 that is not hardened. However, the method of forming the mask 120 is not limited thereto. For example, the mask 120 may be a plate material and having the opening 121 formed through a mechanical, physical, and chemical process.

Figure 5C:
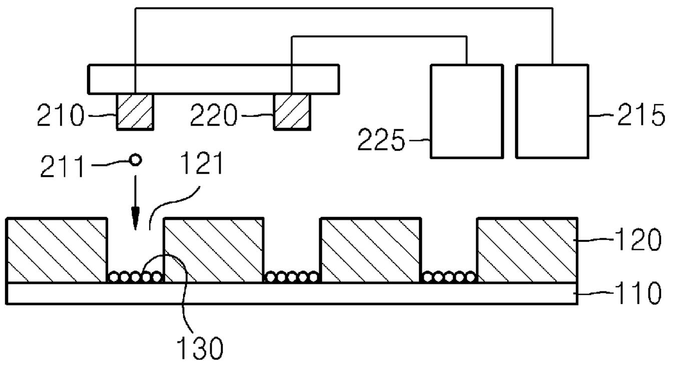

Referring to FIG. 5C, the surface modification inkjet head 210 is placed above the opening 121, and the surface modification ink 211 is ejected onto the surface of the substrate 110 through the opening 121 while moving the surface modification inkjet head 210 along the opening 121. A first modification layer 130 is formed on the surface of the substrate 110 inside the opening 121 using the surface modification ink 211. The surface modification ink 211 is philic to the target ink 221, and may be appropriately selected in consideration of the target ink 221. For example, if the target ink 221 is a solution in which Au, Ag, or Cu conductive particles are distributed in water, the surface modification ink 211 may be formed of, for example, n-tetradecane. The surface modification ink 211 may also include conductive particles. However, the conductive particles are exemplary, and the surface modification ink 211 may be formed of various materials. For example, the surface modification ink 211 may be the same as the target ink 221. In at least one example embodiment, the surface modification ink 211 may be ejected by using the target inkjet head 220 if droplets ejected from the target inkjet head 220 can be controlled to desired sizes.

According to at least one example embodiment, sizes of droplets of the surface modification ink 211 are smaller than those of the target ink 221. The first modification layer 130 may be formed to cover the surface of the substrate 110 inside the opening 121, and may be unnecessarily thick.

Figure 5D:
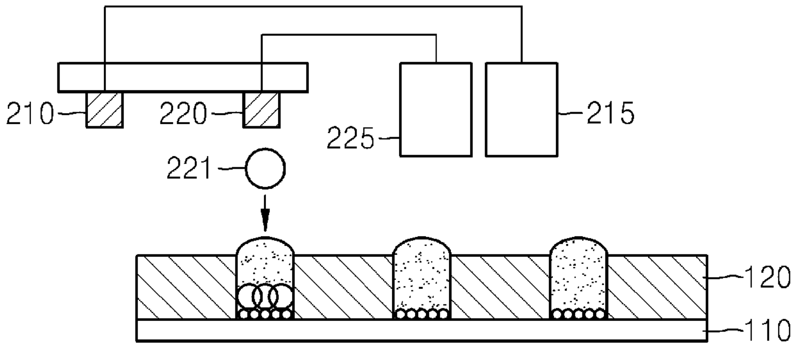
Figure 5E:
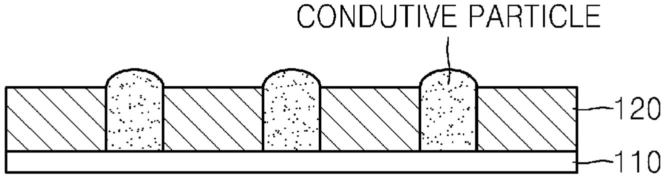
Figure 5F:
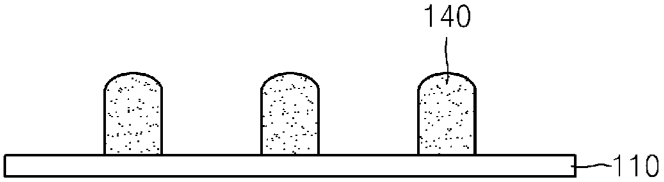

Referring to FIG. 5D, the target inkjet head 220 is placed above the opening 121, and the target ink 221 is ejected onto the first modification layer 130 through the opening 121 while moving the target inkjet head 220 along the opening 121. Since the first modification layer 130 previously formed inside the opening 121 is philic to the target ink 221, a contact angle with respect to the first modification layer 130 of the target ink 221 is small. A plurality of droplets of the target ink 221 ejected inside the opening 121 sufficiently spread on the first modification layer 130 and blend together. If the solvents of the surface modification ink 211 and the target ink 221 are vaporized naturally or via annealing, as shown in FIG. 5E, the conductive particles remain on the surface of the substrate 110. When the mask 120 is removed, as shown in FIG. 5F, conductive patterns 140 may be formed on the substrate 110.

Figure 6:
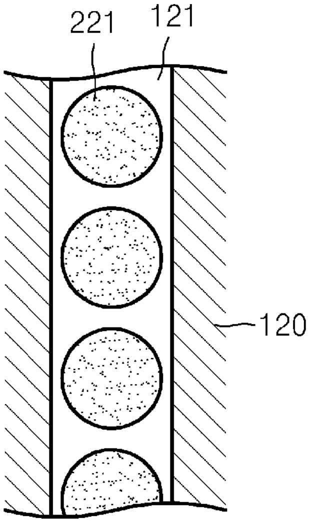
FIG. 6 is a diagram showing target ink on a substrate if a first modification layer is not formed.

FIG. 6 shows a result of ejecting the target ink 221 inside the opening 121 where the first modification layer 130 is not formed. If the target ink 221 is phobic to the substrate 110, the target ink bulges on the substrate 110 due to a large contact angle. FIG. 6 shows that an open circuit may occur in the conductive patterns 140 because the target ink 221 does not completely spread across the surface of the substrate 110. A method according to at least one example embodiment forms the first modification layer 130 that is philic to the target ink 221 on the surface of the substrate 110, and ejects the target ink 221 thereon. Thus, as in example embodiments according to FIG. 7, the target ink 221 does not bulge, and naturally spreads on the first modification layer 130 to form the continuous conductive patterns 140.

Figure 7:
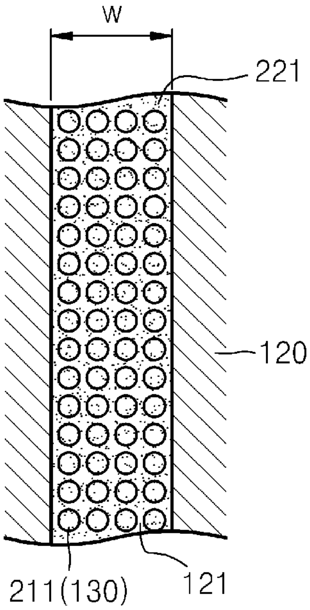
FIG. 7 is a diagram showing a target ink on a substrate if a first modification layer is formed according to example embodiments.

According to at least one example embodiment, sizes of droplets of the surface modification ink 211 are smaller than those of the target ink 221. Accordingly, as shown in FIG. 7, the surface modification ink 211 may form the first modification layer 130 densely stored on the surface of the substrate 110, and thus the target ink 221 ejected onto the first modification layer 130 may readily spread inside the opening 121. The continuous conductive patterns 140 may be formed without being influenced by whether the target ink 221 and the substrate 110 are philic or phobic with respect to each other, and thus the substrate 110 and the target ink 221 are selected with less limitation.

According to at least one example embodiment, the mask 120 is used to form the opening 121 defining a portion where the conductive patterns 140 are to be formed, which prevents the surface modification ink 211 and the target ink 221 from spreading in a direction of width W (of FIG. 7). Thus, occurrences of an electric short-circuit between the neighboring conductive patterns 140 may be reduced (or alternatively, prevented). Further, because thicknesses of the conductive patterns 140 are defined by a thickness of the mask 120, the conductive patterns 140 of desired thicknesses may be easily formed.

According to at least one example embodiment, sizes of droplets of the target ink 221 are larger than those of the surface modification ink 211. Accordingly, a time for forming the conductive patterns 140 having large thicknesses and/or widths W may be reduced. For example, in related art methods, more than about 500 droplets having a diameter of about 5 μm may be ejected to entirely fill the opening 121 of 10 μm in width, 2 μm in height, and 200 μm in length, (assuming that about 20% of a solvent is vaporized). In related art methods, an inkjet head needs to repeat printing about 25 times in a length direction of the opening 121. However, according to at least one example embodiment, the opening 121 may be entirely filled by repeatedly printing droplets of the surface modification ink 211 having a diameter of about 5 μm three times, and then printing about 15 droplets of the target ink 221 having a diameter of 15 μm one time. Thus, according to at least one example embodiment, a processing speed for forming the continuous and relatively thick conductive patterns 140 may be enhanced.

Figure 8:
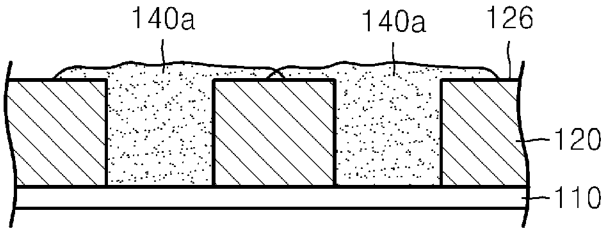
FIG. 8 is a diagram of showing how a target ink spreads on the surface of a mask that is philic to the target ink.
Figure 9:
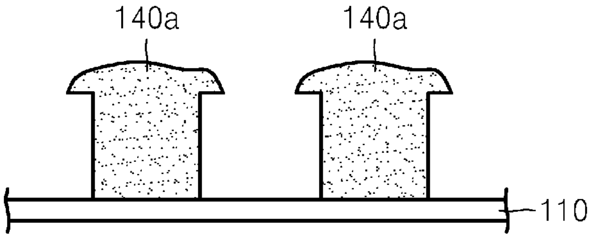
FIG. 9 is a diagram showing conductive patterns formed using a mask that is philic to the target ink.

According to at least one example embodiment, the mask 120 may be a material layer phobic to the target ink 221. An amount of the target ink 221 ejected inside the opening 121 may be determined in consideration of an amount of a vaporized solvent. If the mask 120 and the target ink 221 are highly philic, as shown in FIG. 8, the target ink 221 spreads to a surface 126 of the mask 120 overflowing the opening 121 and thus neighboring conductive patterns 140*a* may be electrically circuit-shorted. Although the neighboring conductive patterns 140*a* are not circuit-shorted, as shown in FIG. 9, widths of the conductive patterns 140*a* may not be consistent.

Figure 10:
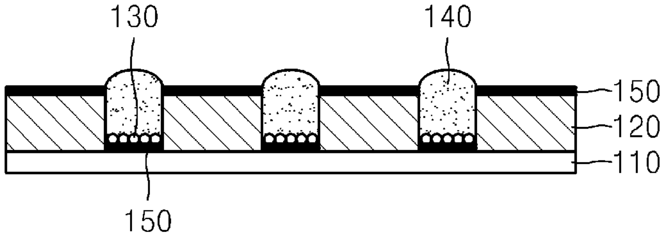
FIG. 10 is a diagram showing a second modification layer that is phobic to the target ink formed on the surface of a mask according to example embodiments.

In at least one other example embodiment and as shown in FIG. 5C and FIG. 10, a second modification layer 150 may be formed on the surface 126 of the mask 120 before the surface modification ink 211 is ejected through the opening 121. The second modification layer 150 may be a material layer phobic to the target ink 221. For example, the second modification layer 150 may be a fluorine layer. However, example embodiments are not limited thereto. The second modification layer 150 may be appropriately selected from among material layers having contact angles of at least 50 or higher degrees with respect to the target ink 221. Accordingly, the target ink 221 does not spread along the surface 126 of the mask 120 that is phobic to the target ink 221 but bulges inside the opening 121 that is relatively philic to the target ink 221. Thus, the conductive patterns 140 having consistent widths and thicknesses may be formed.

According to at least one example embodiment, the second modification layer 150 may be formed only on the surface 126 of the mask 120 and on the surface of the substrate 110 inside the opening 121. If the second modification layer 150 is formed on the surface of the substrate 110 inside the opening 121, the target ink 221 may readily spread inside the opening 121 because the first modification layer 130 that is philic to the target ink 221 is formed on the second modification layer 150.

While example embodiments have been particularly shown and described, it will be understood by one of ordinary skill in the art that variations in form and detail may be made therein without departing from the spirit and scope of the claims. For instance, although example embodiments have been described with reference to inkjet printing and forming conductive patterns, example embodiments are not limited thereto. Example embodiments may also relate to other types of patterns and methods of forming patterns on a substrate.

What is claimed is:

1. A method of forming patterns on a substrate, the method comprising:

placing a mask having an opening defining a portion of one surface of a substrate on which patterns are to be formed on the substrate;

forming a first modification layer in the opening by ejecting a surface modification ink onto a surface of the substrate through the opening;

ejecting a target ink having droplets of sizes larger than those of a surface modification ink such that the target ink is distributed on the first modification layer in the opening; and removing the mask.

2. The method of claim 1, wherein a difference between surface energies of the surface modification ink and the substrate is less than or equal to a difference between surface energies of the target ink and the substrate.

3. The method of claim 1, wherein the surface modification ink and the target ink are the same.

4. The method of claim 1, further comprising:

forming a second modification layer that is phobic to the target ink on at least a surface of the mask before forming the first modification layer.

5. The method of claim 4, wherein the second modification layer is formed on the surface of the substrate inside the opening, and the first modification layer is formed on the second modification layer.

6. The method of claim 4, wherein a contact angle of the target ink with respect to the second modification layer is 50 or more degrees.

7. A method of forming patterns on a substrate, the method comprising:

defining a portion of a surface of a substrate in which patterns are to be formed using a mask having an opening;

forming a first modification layer on the surface of the substrate through the opening, wherein a difference between surface energies of the first modification layer and the substrate is less than or equal to a difference between surface energies of a target ink and the substrate;

ejecting the target ink into the opening such that the target ink is distributed on the first modification layer; and removing the mask.

8. The method of claim 7, wherein the mask is formed of a material that is phobic to the target ink.

9. The method of claim 7, further comprising:

forming a second modification layer that is phobic to the target ink on at least a surface of the mask before forming the first modification layer.

10. The method of claim 9, wherein the second modification layer is formed on the surface of the substrate inside the opening, and the first modification layer is formed on the second modification layer.

11. The method of claim 7, wherein the first modification layer is formed by ejecting a surface modification ink that is philic to the target ink in the opening.

12. The method of claim 11, wherein the surface modification ink and the target ink are the same.

13. The method of claim 11, wherein sizes of droplets of the target ink are larger than those of the surface modification ink.

* * * * *